United States Patent
Fang et al.

(10) Patent No.: US 10,084,424 B2
(45) Date of Patent: Sep. 25, 2018

(54) DEVICE AND A METHOD FOR ADJUSTING ELECTRICAL IMPEDANCE BASED ON CONTACT ACTION

(71) Applicants: Peking University, Beijing (CN); Jilin University, Changchun (CN)

(72) Inventors: Daining Fang, Beijing (CN); Hao Zhou, Beijing (CN); Yongmao Pei, Beijing (CN); Faxin Li, Beijing (CN); Hongwei Zhao, Beijing (CN); Ji Fu, Beijing (CN)

(73) Assignees: Peking University, Beijing (CN); Jilin University, Changchun (CN)

( * ) Notice: Subject to any disclaimer, the term of this patent is extended or adjusted under 35 U.S.C. 154(b) by 0 days.

(21) Appl. No.: 15/533,121

(22) PCT Filed: May 18, 2015

(86) PCT No.: PCT/CN2015/079148
§ 371 (c)(1),
(2) Date: Jun. 5, 2017

(87) PCT Pub. No.: WO2016/183760
PCT Pub. Date: Nov. 24, 2016

(65) Prior Publication Data
US 2018/0076787 A1    Mar. 15, 2018

(51) Int. Cl.
*H03H 7/38*    (2006.01)
*H03H 7/40*    (2006.01)
*G01R 27/02*    (2006.01)
*H01L 41/04*    (2006.01)
*H01L 41/187*    (2006.01)

(52) U.S. Cl.
CPC ............... *H03H 7/38* (2013.01); *G01R 27/02* (2013.01); *H01L 41/042* (2013.01); *H03H 7/40* (2013.01); *H01L 41/1876* (2013.01)

(58) Field of Classification Search
CPC .................................. H03H 7/38; H03H 7/40
USPC ............................................ 333/32, 33, 17.3
See application file for complete search history.

(56) References Cited

FOREIGN PATENT DOCUMENTS

| CN | 101236220 | * | 8/2008 | ............ G01R 27/02 |
| CN | 201364363 | * | 12/2009 | ............ G01R 27/02 |

* cited by examiner

*Primary Examiner* — Stephen E Jones
(74) *Attorney, Agent, or Firm* — SV Patent Service

(57) ABSTRACT

A device and associated method for adjusting electrical impedance based on contact action are disclosed. The device includes a drive unit (1), a contact unit (2), a monitoring unit (3), and a control unit (4). The monitoring unit (3) measures an impedance signal of an electromagnetic functional material (7) in an alternating-current circuit, and transfers the impedance signal to the control unit (4). In response to the impedance signal measured by the monitoring unit (3), the control unit (4) controls the drive unit (1) to apply a mechanical load on the contact unit (2), which causes the contact unit (2) to contact the electromagnetic functional material (7). The value of a contact load is adjusted, so as to adjust the electrical impedance of the electromagnetic functional material (7), thereby achieving the objective of adjusting the impedance matching in the alternating-current circuit in real time.

10 Claims, 7 Drawing Sheets

DEVICE AND A METHOD FOR ADJUSTING ELECTRICAL IMPEDANCE BASED ON CONTACT ACTION

TECHNICAL FIELD

The present invention relates to impedance matching design in alternating current circuits and to the field of nanotechnologies, and in particular, to a device and associated method for electrical impedance adjusting using a local contact action.

BACKGROUND OF THE INVENTION

In recent years, with the continuous development of material preparation technologies, the characteristic sizes of functional materials have entered nano scale. Various types of electromagnetic devices are getting smaller and smaller. New micro/nano-electromechanical systems continue to emerge. In circuit design and device application, circuit impedance matching design and adjustment are needed during the design phase and the operation process, in order to maximize various load powers, to keep the output power of the excitation source not significantly changed as the ambient temperature changes, or to avoid introducing significant impact or security risks to the normal operations of the original elements when other components are connected to the circuit. Therefore, adjusting and regulating the impedance of a certain component in a circuit in real-time becomes one of the important issues that concerns the scientists and engineers in this field.

In general, the adjustment of circuit impedance is achieved by connecting standard resistors, capacitors, or inductance elements in parallel or in series with the original circuit. This method is, however, mostly used in the design phase of the product. In the operation process, the circuit impedance adjustment is achieved by adjusting the volume or the number of resistors, capacitors, or inductance elements in the circuit. These methods are feasible at macroscopic scale, but are more difficult to implement at the micron scale, and will face great challenges at the nanoscale. For the above reasons, the design and application of micro/nano-electromechanical systems are seriously restricted.

SUMMARY OF THE INVENTION

The present invention aims at providing a device and method thereof for adjusting an electrical impedance of an electromagnetic functional material by using contact actions at micro/nano-scale. The method does not need to change the components in the circuit, and has the advantages of convenient operation, real-time adjustment and is advantageous in micro/nano-electromechanical systems.

In particular, the technical solution of the present invention is as follows:

An electrical impedance adjusting device based on contact action, referring to FIG. 1, includes a drive unit 1, a contact unit 2, a monitoring unit 3, and a control unit 4. The contact unit 2 is configured to contact an electromagnetic functional material to be adjusted. The monitoring unit 3 is configured to measure an impedance signal of the electromagnetic function material and transfer the impedance signal to the control unit 4. The drive unit 1 is fixedly connected to the contact unit 2. In response to the impedance signal measured by the monitoring unit 3, the control unit 4 controls the drive unit 1 to apply a mechanical load on the contact unit 2, which causes the contact unit 2 to contact the electromagnetic functional material. The control unit 4 adjusts the value of a contact load, so as to adjust the electrical impedance of the electromagnetic functional material.

Optionally, the drive unit 1 can be in particular a piezoelectric actuator, such as a lead zirconate titanate ceramics piezoelectric actuator or a lead magnesium niobate-lead titanate single crystal piezoelectric actuator. The piezoelectric actuator is fixedly connected to the contact unit 2 and is electrically connected to the control unit 4. The contact unit 2 is driven to displace slightly under the action of the control unit 4.

The contact unit 2 can be, in particular, a conductive indenter. The tip of the conductive indenter can be made of a material such as boron-doped diamond or cemented carbide. The shape of the tip may be spherical or frusto-conical. The size of the tip can be in the nano-scale or micro-scale. The tip is fixedly connected to the drive unit 1 through gluing or threading.

The monitoring unit 3 can be, in particular, an impedance measuring apparatus, which is connected to the conductive indenter and a bottom electrode of the electromagnetic functional material via two wires respectively. Furthermore, the monitoring unit 3 can further include a precision displacement sensor such as a capacitive displacement sensor. The capacitive sensor head of a capacitive displacement sensor is formed by an upper capacitor plate and a lower capacitor plate, which are respectively fixed on a main structure of the electric impedance adjusting device and an end of the drive unit 1, for measuring the displacement of the contact unit 2.

The control unit 4 is respectively connected to the monitoring unit 3 and the drive unit 1, which can be a data reading and control apparatus.

According to the above-mentioned electrical impedance adjusting device, the present invention provides a method for electrical impedance adjusting based on contact action. The method can include the following steps (as shown in FIG. 2):

(1) under the control of a control unit 4, applying a mechanical load on a contact unit 2 by a drive unit 1 to cause the contact unit 2 to contact an electromagnetic functional material to be adjusted in an alternating-current circuit;

(2) monitoring an impedance signal of the electromagnetic functional material in real time by a monitoring unit 3; and (3) in response to the impedance signal measured by the monitoring unit 3, adjusting the mechanical load of the drive unit 1 by the control unit 4, varying a value of the contact load on the electromagnetic functional material applied by the contact unit 2, and adjusting an electrical impedance of the electromagnetic functional material, thereby achieving the objective of adjusting an impedance matching in the alternating-current circuit in real time For a layered electromagnetic composite material, when the above method is used to adjust the electrical impedance, there is an empirical relationship between electrical impedance amplitude $|Z(f)|$ and a contact displacement $h(f)$ of the mechanical load at an AC frequency f:

$$\frac{|Z(f)|}{|Z_0(f)|} = \sqrt{1 + \frac{h(f)^*}{h(f)}} \qquad (1)$$

wherein $|Z_0(f)|$ and $h(f)^*$ are respectively an impedance amplitude parameter and a contact displacement parameter, which are related to a thickness of the layered electromagnetic composite material and the AC frequency, which can be determined by experiment.

It can be seen that the amplitude of the electrical impedance of the layered electromagnetic composite material at a certain contact displacement can be calculated by the above equation (1) after the impedance amplitude parameter $|Z_0(f)|$ and the contact depth parameter $h(f)^*$ are experimentally determined. Therefore, in the step (3) of the electrical impedance adjusting method, a desired electrical impedance value can be obtained by controlling the contact load to reach a certain contact displacement.

The presently disclosed method for adjusting electrical impedance achieves electrical impedance adjustment in electromagnetic functional films and other materials in the micro/nano electromechanical system circuit by applying contact action at micro-nano scales. Thus impedance can be matched in the circuit in real time when electrical loads or the environment temperature change.

The present invention has the following advantages and outstanding effects: (1) the method of adjusting impedance of the electromagnetic functional material by means of mechanical contact is proposed for the first time; (2) the components in the circuit do not need to change during the adjusting process; (3) the impedance may be matched in the circuit in real time in the situation that the electrical load or the environment temperature changes, the impedance matching may be achieved, and the operation is convenient; and (4) since the contact occurs at the micro-nano scale, the disclosed method has a unique advantage in micro/nano electromechanical system applications:

The part numbers in the figures are: 1—the drive unit; 2—the contact unit; 3—the monitoring unit; 4—the control unit; 5—the piezoelectric actuator; 6—the conductive indenter; 7—the electromagnetic functional material; 8—the impedance measuring apparatus; 9—the precision displacement sensor; 10—the data reading and controlling apparatus.

DETAILED DESCRIPTION OF THE INVENTION

The technical details and embodiments of the present invention will be further described in the following with reference to the accompanying drawings.

Figure 1:
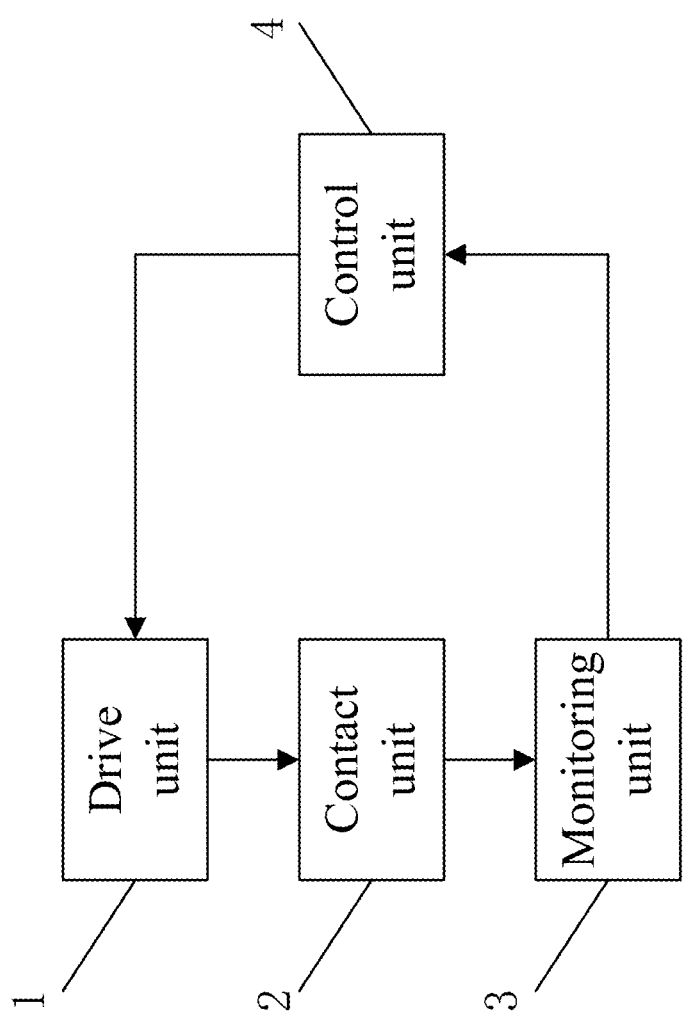
FIG. 1 is a block diagram of the technical units of the electrical impedance adjusting device in accordance with by the present invention.
Figure 2:
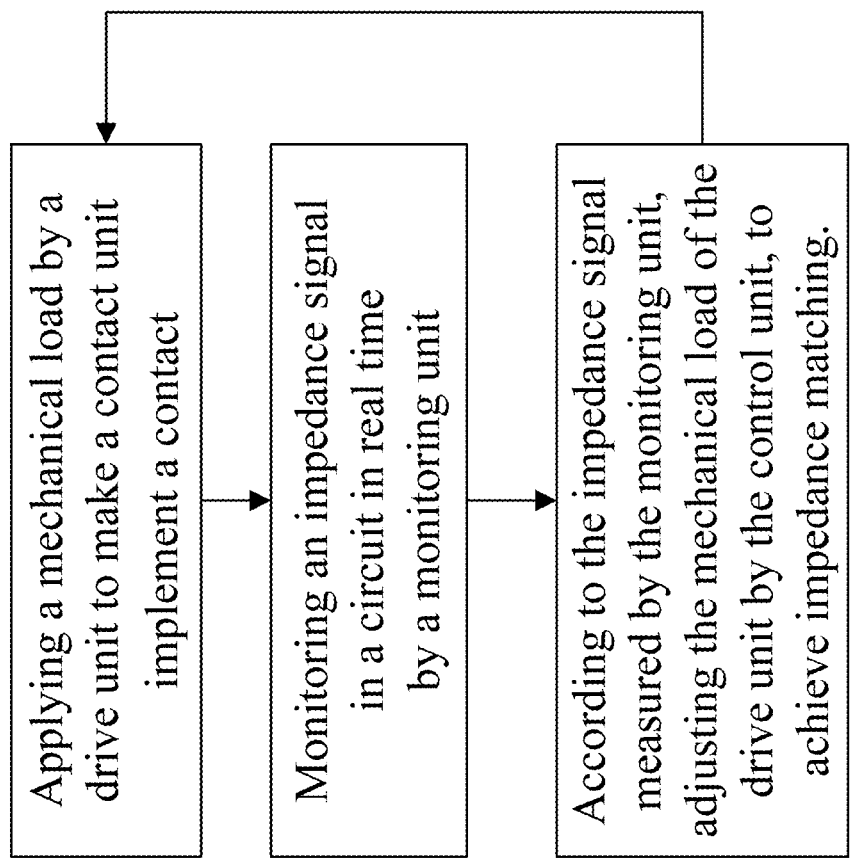
FIG. 2 is a flow chart for an electrical impedance adjusting method in accordance with by the present invention.
Figure 3:
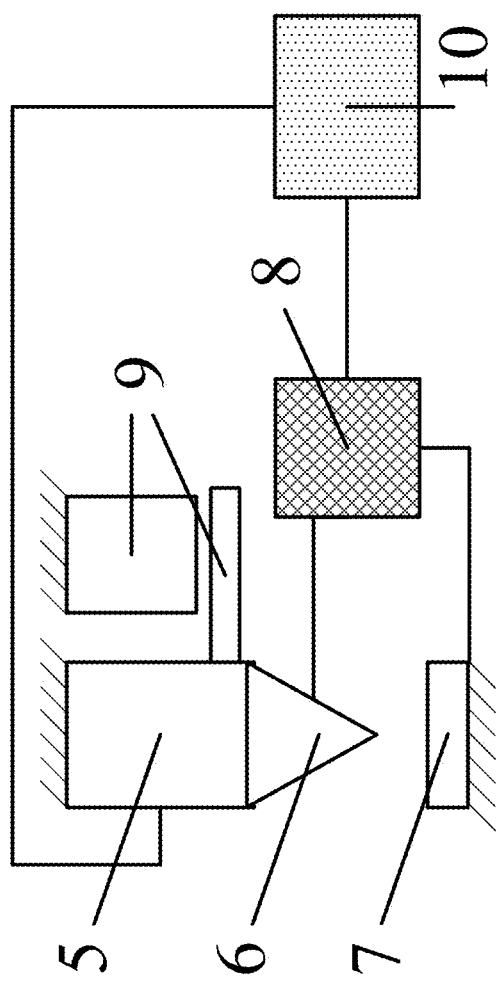
FIG. 3 is a schematic diagram showing an experiment device for adjusting electrical impedance in accordance with some embodiments of the present invention.

In some embodiments, referring to FIG. 3, an experiment device for adjusting the electrical impedance based on contact action mainly consists of a PZT ceramic piezoelectric actuator 5, a conductive indenter 6, an electromagnetic functional material 7, an impedance measuring apparatus 8, a capacitive precision displacement sensor 9, and a data reading and controlling apparatus 10.

The tip of the conductive indenter 6 can be spherical, having a radius of curvature of the spherical part about 500 µm. The data reading and controlling apparatus 10 can make the PZT ceramic piezoelectric actuator 5 to be vertically elongated to cause the conductive indenter 6 to contact the electromagnetic functional material 7. The data reading and controlling apparatus 10 can adjust the magnitude of the contact load, thereby adjusting the electrical impedance of the electromagnetic functional material. The capacitive precision displacement sensor 9 measures the displacement signal during the contact. The impedance measuring apparatus 8 is respectively connected to the conductive indenter 6 and the electromagnetic functional material 7, to measure the change pattern in the electrical impedance of the electromagnetic functional material 7 under different contact loads.

Figure 4B:
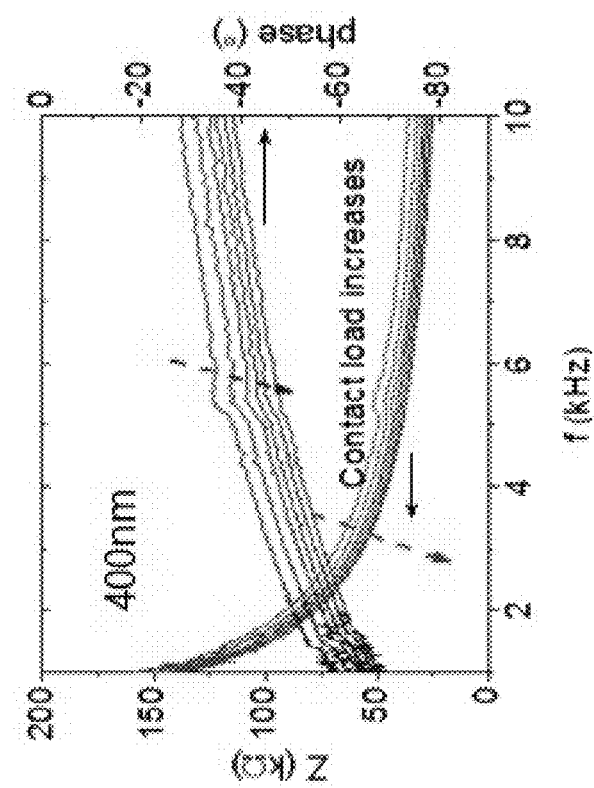
FIGS. 4A-4C are graphs showing the relationships between the electrical impedance and the AC frequency of the layered electromagnetic composite materials $La_{0.7}Sr_{0.3}MnO_3$/PMN-PT in different thicknesses and applied with different contact loads in accordance with some embodiments of the present invention, where FIGS. 4A, 4B, 4C respectively correspond to ferromagnetic layers $La_{0.7}Sr_{0.3}MnO_3$ having thicknesses of 200 nm, 400 nm, and 600 nm.
Figure 4A:
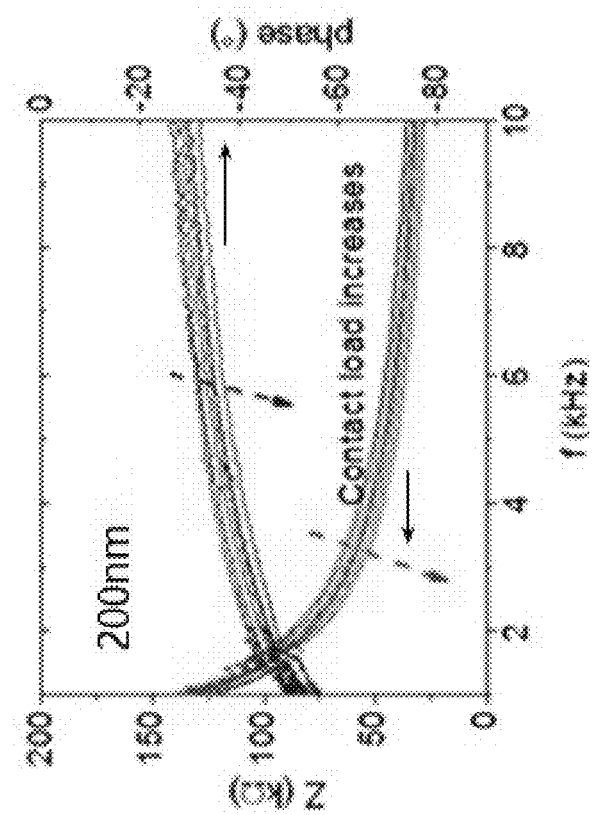
Figure 4C:
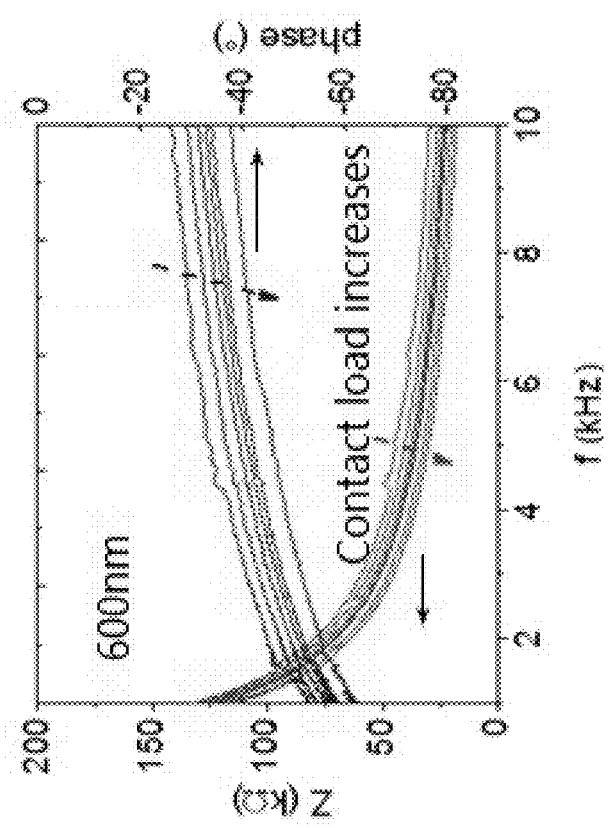

Three layered electromagnetic composite material $La_{0.7}Sr_{0.3}MnO_3$/PMN-PT of different thicknesses were used as the electromagnetic function experimental material. The thicknesses of the ferromagnetic layers $La_{0.7}Sr_{0.3}MnO_3$ were 200 nm, 400 nm, and 600 nm respectively. The ferroelectric layer PMN-PT has the thickness of 500 µm. The PZT ceramic piezoelectric actuator 5 was controlled to carry out contact loading or unloading process. During the contact loading process, the loads of 4, 8, 12, 16, 24, 32, 40 mN were applied and held for a while (the corresponding amounts of contact deformation were in the range of 18~80 nm), the electrical impedance of a sample was measured. The relationship between the electrical impedance (including the amplitude Z and phase) under seven contact loads and the AC frequency (f) is shown in FIGS. 4A-4C. It can be seen that for any sample, at any frequency, the impedance (amplitude and phase) of the layered electromagnetic composite material decreases as the contact load increases (the directions of the arrows).

Figure 5B:
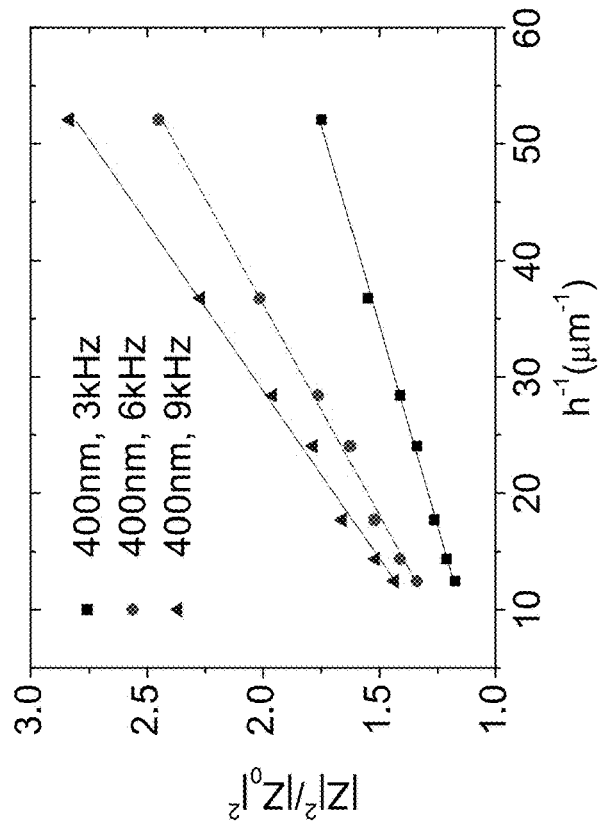
FIGS. 5A-5C are graphs showing the relationships between the electrical impedance and the contact displacement of the layered electromagnetic composite material $La_{0.7}Sr_{0.3}MnO_3$/PMN-PT in different thicknesses in accordance with some embodiments of the present invention, where FIGS. 5A, 5B, 5C respectively correspond to ferromagnetic layers $La_{0.7}Sr_{0.3}MnO_3$ having thicknesses of 200 nm, 400 nm, and 600 nm.
Figure 5A:
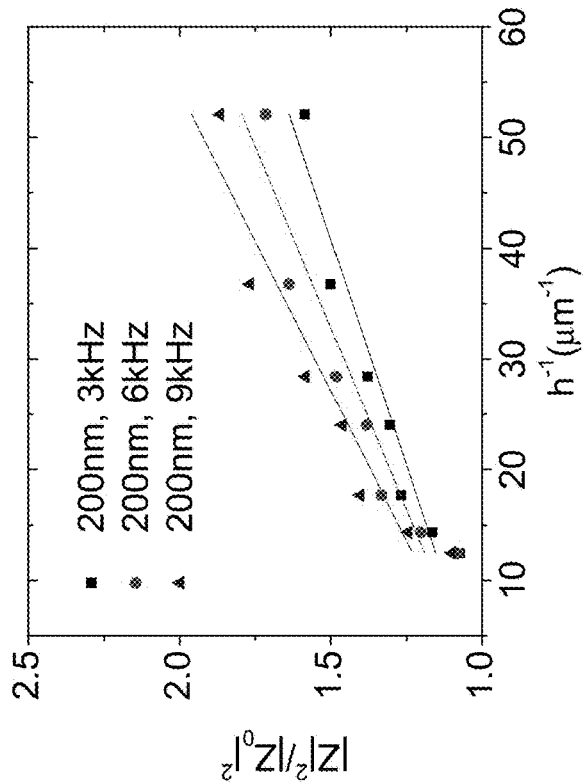
Figure 5C:
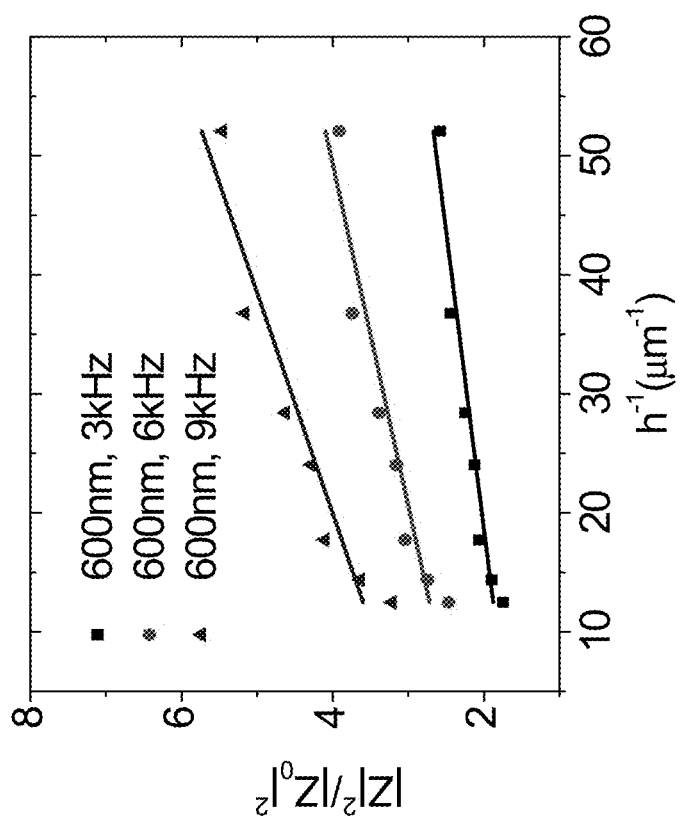

For the three samples, three AC frequencies of 3 kHz, 6 kHz, and 9 kHz were respectively taken. The impedance mode $|Z|$ was squared, and the inverse of the contact displacement h was calculated. The relationships between them are shown in FIGS. 5A-5C. It can be seen that there is an approximate linear relationship between the square of the amplitude of the impedance and the inverse of the contact displacement at the AC frequencies within the range of the experimental parameters. The linear relationship can be expressed by the following function:

$$\frac{|Z(f)|}{|Z_0(f)|} = \sqrt{1 + \frac{h(f)^*}{h(f)}}$$

where |Z(f)| is the amplitude of the electrical impedance, h(f) is the contact displacement, and f is the frequency of the alternating current signal. The two characteristic parameters, the impedance amplitude parameter and the contact depth parameter are related respectively to the thickness of the layered electromagnetic composite material and the AC frequency, which can be obtained, for example, by linear fitting of the data points in FIGS. 5A-5C.

In addition, the present invention provides a method for adjusting electrical impedance based on contact action. The precision displacement sensor 9 and the impedance measuring apparatus 8 are configured to test and illustrate that the electrical impedance properties of materials can be regulated by a local contact, and to provide the relationship between the impedance and the nano-scale contact displacement. In an actual application, as it is readily understood by those skilled in the art, the precision displacement sensor 9 does not have to be included, and the impedance measuring apparatus 8 may be replaced by a device that monitors other physical quantities.

What is claimed is:

1. A device for adjusting electrical impedance based on contact action, comprising:
   a drive unit;
   a contact unit configured to contact an electromagnetic functional material to be adjusted, wherein the drive unit is fixedly connected to the contact unit;
   a monitoring unit configured to measure an impedance signal of the electromagnetic function material; and
   a control unit electrically connected to the drive unit and configured to receive the impedance signal from the monitoring unit, wherein in response to the impedance signal, the control unit is configured to control the drive unit to apply a mechanical load on the contact unit to cause the contact unit contact the electromagnetic functional material, wherein the control unit is configured to adjust a value of a contact load so as to adjust an electrical impedance of the electromagnetic functional material.

2. The device of claim 1, wherein the drive unit comprises a piezoelectric actuator, wherein the piezoelectric actuator is fixedly connected to the contact unit.

3. The device of claim 2, wherein the drive unit comprises a lead zirconate titanate ceramics piezoelectric actuator or a lead magnesium niobate-lead titanate single crystal piezoelectric actuator.

4. The device of claim 1, wherein the contact unit comprises a conductive indenter having a spherical or frustum-shaped tip with a size in nano-scale or micro-scale.

5. The device of claim 4, wherein the monitoring unit comprises an impedance measuring apparatus electrically connected respectively to the conductive indenter and a bottom electrode on the electromagnetic functional material.

6. The device of claim 5, wherein the monitoring unit further comprises a precision displacement sensor configured to measure a displacement of the contact unit.

7. The device of claim 6, wherein the precision displacement sensor comprises a capacitive displacement sensor,
   wherein the capacitive displacement sensor comprises a capacitive sensor head formed by an upper capacitor plate and a lower capacitor plate,
   wherein the electric impedance adjusting device further comprises a main structure,
   wherein the upper capacitor plate and the lower capacitor plate are respectively fixed on the main structure and an end of the drive unit.

8. A method for adjusting electrical impedance based on contact action to adjust impedance matching in an alternating-current circuit in real time, comprising the steps of:
   1) under the control of a control unit, applying a mechanical load on a contact unit by a drive unit to cause the contact unit to contact an electromagnetic functional material to be adjusted;
   2) monitoring an impedance signal of the electromagnetic functional material in real time by a monitoring unit; and
   3) in response to the impedance signal measured by the monitoring unit, adjusting the mechanical load of the drive unit by the control unit, varying a value of a contact load on the electromagnetic functional material applied by the contact unit, and adjusting an electrical impedance of the electromagnetic functional material.

9. The method of claim 8, wherein the electromagnetic functional material comprises a layered electromagnetic composite material, the method further comprising:
   adjusting an electrical impedance of the layered electromagnetic composite material.

10. The method of claim 9, wherein an amplitude of the electrical impedance of the layered electromagnetic composite material is adjusted according to the following equation:

$$\frac{|Z(f)|}{|Z_0(f)|} = \sqrt{1 + \frac{h(f)^*}{h(f)}} \quad (1)$$

where h(f) represents a contact displacement of the mechanical load on the material at AC frequency f, |Z(f)| represents a corresponding amplitude of the electrical impedance, $|Z_0(f)|$ and h(f)* are respectively an impedance amplitude parameter and a contact displacement parameter, which are related to a thickness of the layered electromagnetic composite material and the AC frequency, wherein in step 3) the value of the contact load is controlled to reach a predetermined contact displacement.

* * * * *